(12) United States Patent
Chen

(10) Patent No.: US 8,565,040 B1
(45) Date of Patent: Oct. 22, 2013

(54) VOLTAGE REGULATOR CIRCUIT

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 58 days.

(21) Appl. No.: 13/474,226

(22) Filed: May 17, 2012

(51) Int. Cl.
*G11C 5/14* (2006.01)

(52) U.S. Cl.
USPC .................. 365/226; 365/189.009; 365/229

(58) Field of Classification Search
None
See application file for complete search history.

(56) References Cited

U.S. PATENT DOCUMENTS

| | | | |
|---|---|---|---|
| 5,303,190 A * | 4/1994 | Pelley, III | 365/189.11 |
| 5,337,284 A | 8/1994 | Cordoba et al. | |
| 6,639,864 B2 * | 10/2003 | Sundaram et al. | 365/226 |
| 7,548,466 B2 * | 6/2009 | Park et al. | 365/189.09 |
| 7,848,151 B2 * | 12/2010 | Chan et al. | 365/185.23 |
| 8,031,550 B2 * | 10/2011 | Chen | 365/227 |

* cited by examiner

*Primary Examiner* — Tan T. Nguyen
(74) *Attorney, Agent, or Firm* — WPAT, P.C.; Anthony King

(57) ABSTRACT

A voltage regulator circuit for providing power management for a memory device is disclosed. The voltage regulator circuit comprises a voltage regulator and a switch circuit. The switch circuit includes a first oscillator to generate an oscillating signal, and a pulse generator to generate a pulse signal in response to the oscillating signal. The voltage regulator provides a current during standby mode of the memory device in response to the pulse signal. The current is smaller than one provided by the voltage regulator during normal mode of the memory device.

20 Claims, 4 Drawing Sheets

VOLTAGE REGULATOR CIRCUIT

BACKGROUND OF THE INVENTION

1. Field of the Invention

The current disclosure relates to power management for a memory device and, in particular, to a voltage regulator circuit that supports power management for a memory device.

2. Description of the Related Art

Voltage regulators are used to regulate a voltage level and supply internal power. A memory device, such as a dynamic random access memory (DRAM), may operate in normal mode or active mode, during which mode a reading or writing operation may be performed. Voltage regulators may be used to provide a relatively large current for the reading or writing operation. On the other hand, the memory device may operate in standby mode, during which mode a refresh operation may be performed. However, in the standby mode, only a small current is required to maintain data in the memory device.

It may therefore be desirable to have a voltage regulator circuit that provides a relatively large current during normal mode of a memory device, and provides a relatively small current during standby mode of the memory device.

SUMMARY OF THE INVENTION

Embodiments of the present invention provide a voltage regulator circuit for providing power management for a memory device. The voltage regulator circuit comprises a voltage divider, a voltage regulator and a switch circuit. The voltage regulator includes an output coupled to the voltage divider and regulates a voltage level at the output. The switch circuit includes a first oscillator to generate an oscillating signal, and a pulse generator to generate a pulse signal in response to the oscillating signal. The voltage regulator provides a current during standby mode of the memory device in response to the pulse signal. The current is smaller than one provided by the voltage regulator during normal mode of the memory device.

Some embodiments of the present invention also provide a voltage regulator circuit for providing power management for a memory device. The voltage regulator circuit comprises a voltage regulator and a switch circuit. The switch circuit includes a first oscillator to generate an oscillating signal, and a pulse generator to generate a pulse signal in response to the oscillating signal. The voltage regulator provides a current during standby mode of the memory device in response to the pulse signal. The current is smaller than one provided by the voltage regulator during normal mode of the memory device.

In order to have further understanding of the techniques, means, and effects of the current disclosure, the following detailed description and drawings are hereby presented, such that the purposes, features and aspects of the current disclosure may be thoroughly and concretely appreciated; however, the drawings are provided solely for reference and illustration, without any intention to be used for limiting the current disclosure.

BRIEF DESCRIPTION OF THE DRAWINGS

The objectives and advantages of the present invention are illustrated with the following description and upon reference to the accompanying drawings in which.

DETAILED DESCRIPTION OF THE INVENTION

The present invention discloses a voltage regulator circuit for a memory device.

Figure 1:
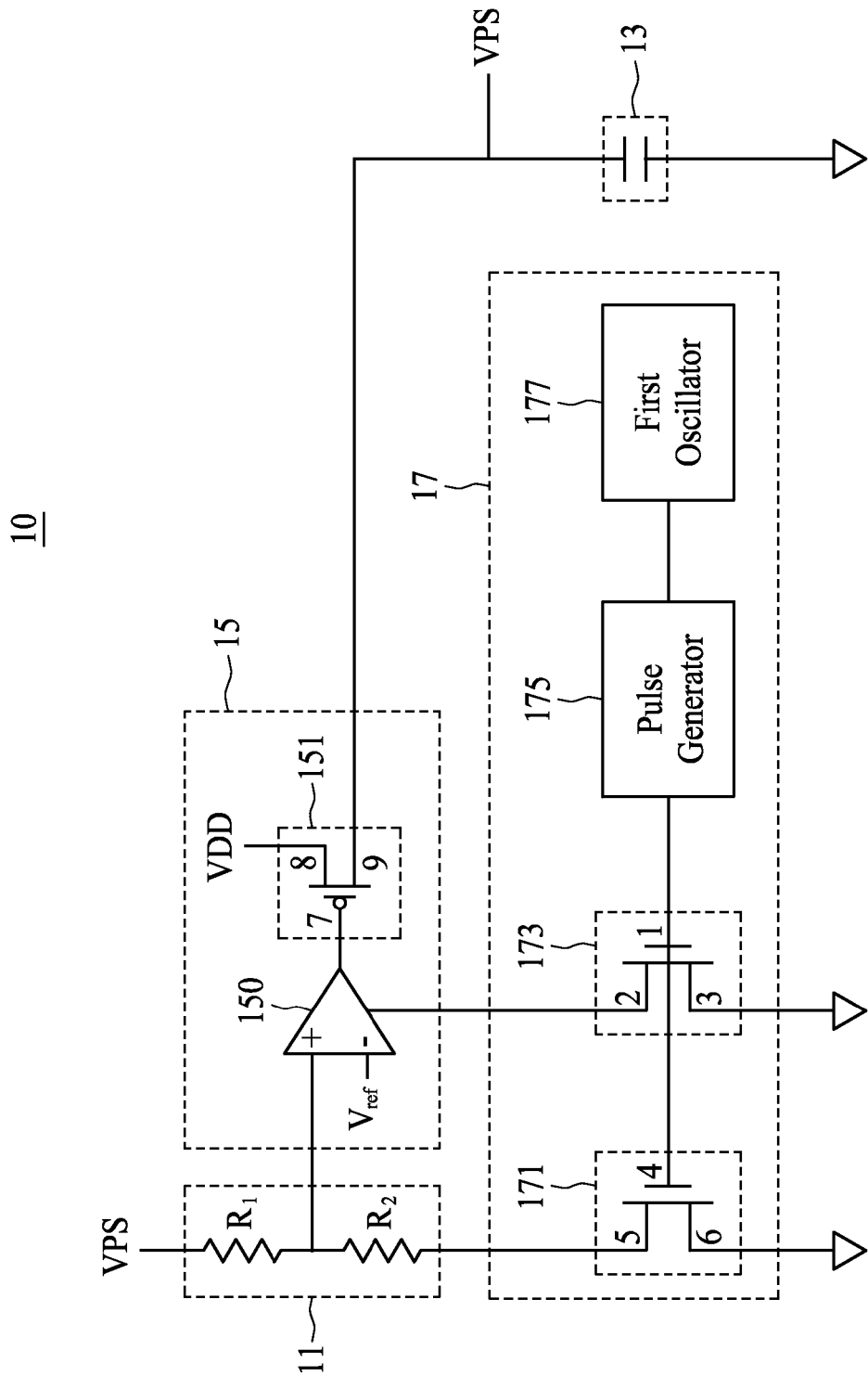
FIG. 1 is a schematic block diagram of a voltage regulator circuit in accordance with an embodiment of the present invention.

FIG. 1 is a schematic block diagram of a voltage regulator circuit 10 in accordance with an embodiment of the present invention. Referring to FIG. 1, the voltage regulator circuit 10 may include a voltage divider 11, a capacitor 13, an active-mode voltage regulator 15 and a switch circuit 17.

The voltage divider 11 includes resistors $R_1$ and $R_2$ connected in series.

The active-mode voltage regulator 15, coupled between the voltage divider 11 and the capacitor 13, includes an operational amplifier 150 and a transistor 151. The operational amplifier 150, which may serve as a comparator, includes a non-inverting terminal coupled to a point between the resistors R1 and R2, and an inverting terminal coupled to a reference voltage Vref. The transistor 151, in the present embodiment a p-type MOS (PMOS) transistor, includes a gate terminal 7 coupled to an output (not numbered) of the operational amplifier 150, a source terminal 8 coupled to a voltage source VDD, and a drain terminal 9 coupled to the capacitor 13. A voltage level "VPS" at the drain terminal is fed back to the voltage divider 11, specifically, one end of the resistor R1. Moreover, the capacitor 13 may function to stabilize the voltage level VPS.

The switch circuit 17 may include a first oscillator 177, a pulse generator 175, a first transistor 173 and a second transistor 171. The first transistor 173 includes a gate terminal 1 coupled to the pulse generator 175, a drain terminal 2 coupled to the operational amplifier 150, and a source terminal 3 coupled to ground. Moreover, the second transistor 171 includes a gate terminal 4 coupled to the pulse generator 175, a drain terminal 5 coupled to the voltage divider 11, and a source terminal 6 coupled to ground. Persons having ordinary skill in the art will understand that a source terminal and a drain terminal may be interchangeable, depending on the voltage levels applied thereto.

The first oscillator 177 may be configured to generate an oscillating signal. In response to the oscillating signal, the pulse generator 175 generates a pulse signal. The oscillating signal has a period greater than the pulse width of the pulse signal. In one embodiment according to the present invention, during normal mode of a memory device associated with the voltage regulator circuit 10, the pulse signal may be bypassed or ignored and the first and second transistors 173 and 171 are turned on by, for example, an additional high-level signal. Furthermore, during standby mode of the memory device, the pulse signal is sent to the first and second transistors 173 and 171, which turns on the transistors 173 and 171.

In operation, during normal mode, the additional signal turns on the transistors 173 and 171. Accordingly, when the voltage level VPS rises above a predetermined level, the operational amplifier 150 outputs a high-level signal, which turns off the PMOS transistor 151, allowing VPS to fall from above the predetermined level. On the other hand, when the voltage level VPS falls below the predetermined level, the operational amplifier 150 outputs a low-level signal, which turns on the PMOS transistor 151, allowing VPS to rise from below the predetermined level. The transistors 173 and 171 are kept at an "on" state during the normal mode so that a relatively large current may be provided to the memory device.

During standby mode, the pulse signal from the pulse generator 175 turns on the transistors 173 and 171. The transistors 173 and 171 are kept at an "on" state for the pulse width of the pulse signal, and are turned off after the pulse width. In one embodiment, the pulse signal is generated at a rising edge of the oscillating signal. As a result, the transistors 173 and 171 are not turned on until a next pulse signal is generated. Accordingly, during the standby mode, only a relatively small current may be provided to the memory device.

Figure 2:
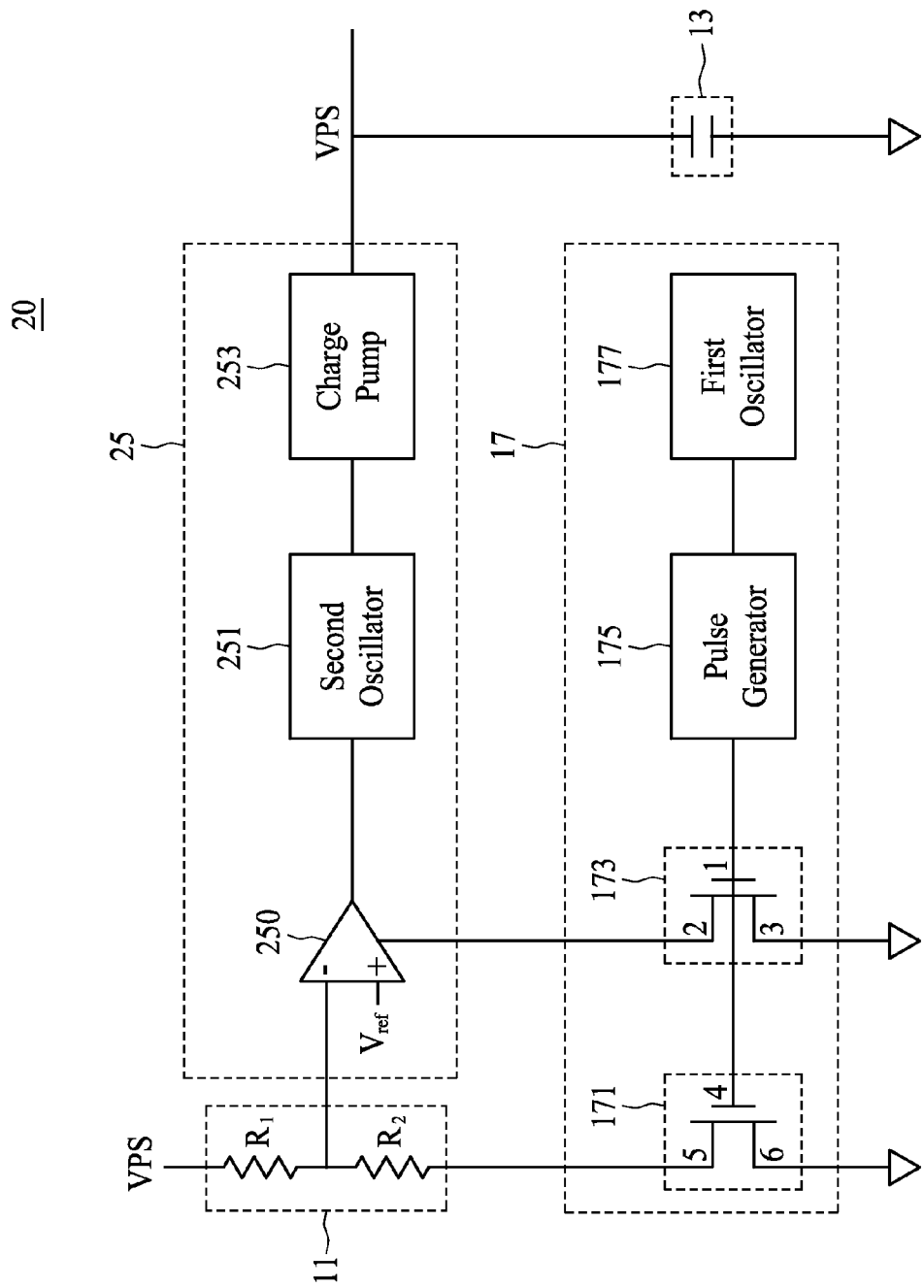
FIG. 2 is a schematic block diagram of a voltage regulator circuit in accordance with another embodiment of the present invention.

FIG. 2 is a schematic block diagram of a voltage regulator circuit 20 in accordance with another embodiment of the present invention. Referring to FIG. 2, the voltage regulator circuit 20 is similar to the voltage regulator circuit 10 illustrated in FIG. 1 except that, for example, an active-mode voltage regulator 25 replaces the active-mode voltage regulator 15 in FIG. 1. Specifically, the active-mode voltage regulator 25 may include an operational amplifier 250, a second oscillator 251 and a charge pump 253. The operational amplifier 250, which may serve as a comparator, includes an inverting terminal coupled to a point between the resistors $R_1$ and $R_2$, and a non-inverting terminal coupled to a reference voltage $V_{ref}$. The second oscillator 251 is coupled between an output (not numbered) of the operational amplifier 250 and the charge pump 253.

In operation, during normal mode of a memory device associated with the voltage regulator circuit 20, the additional signal turns on the transistors 173 and 171. Accordingly, when the voltage level VPS rises above a predetermined level, the operational amplifier 250 outputs a low-level signal, which turns off the second oscillator 251 and in turn the charge pump 253, allowing VPS to fall from above the predetermined level. On the other hand, when the voltage level VPS falls below the predetermined level, the operational amplifier 250 outputs a high-level signal, which turns on the second oscillator 251 and in turn the charge pump 253, allowing VPS to rise from below the predetermined level. The transistors 173 and 171 are kept at an "on" state during the normal mode so that a relatively large current may be provided to the memory device associated with the voltage regulator circuit 20.

During standby mode, the pulse signal from the pulse generator 175 turns on the transistors 173 and 171. The transistors 173 and 171 are kept at an "on" state for the pulse width of the pulse signal, and are turned off after the pulse width. Accordingly, during the standby mode, only a relatively small current may be provided to the memory device.

Figure 3:
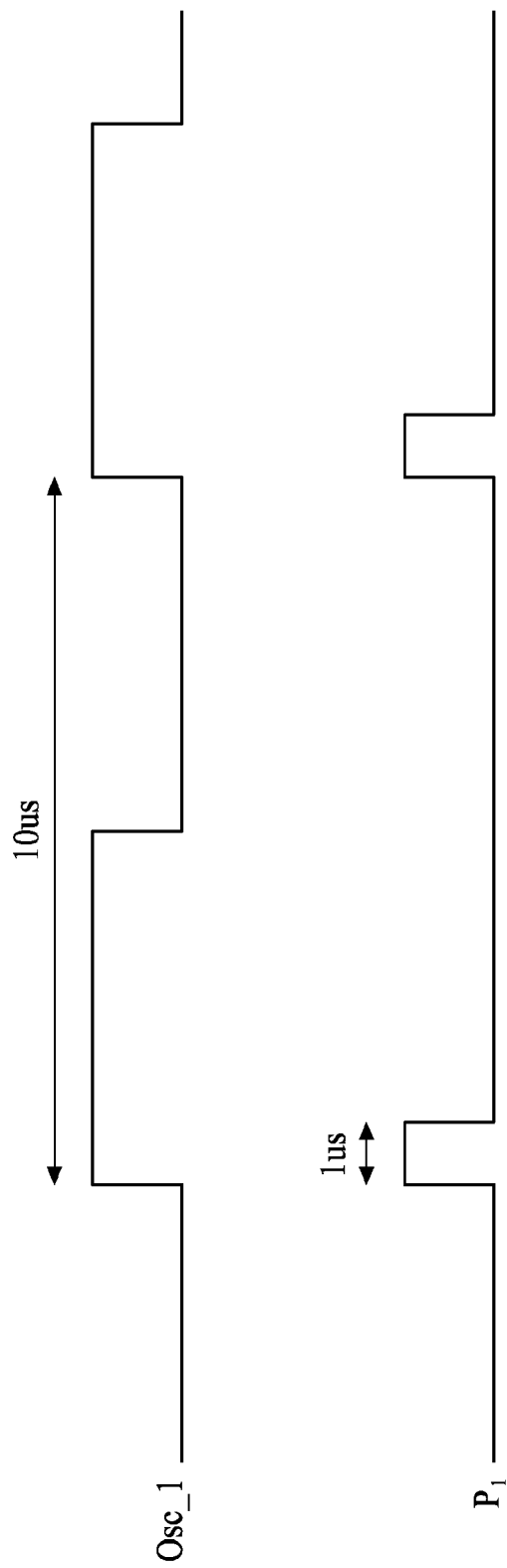
FIG. 3 is a timing diagram illustrating an oscillating signal and a pulse signal generated in accordance with an embodiment of the present invention.

FIG. 3 is a timing diagram illustrating an oscillator signal Osc_1 and a pulse signal $P_1$ generated in accordance with an embodiment of the present invention. Referring to FIG. 3, the pulse signal $P_1$ may be generated at a rising edge of the oscillating signal Osc_1. Furthermore, the pulse signal $P_1$ may have a pulse width of approximately 1 microsecond (μs) and the oscillating signal Osc_1 may have a period of approximately 10 μs.

Figure 4:
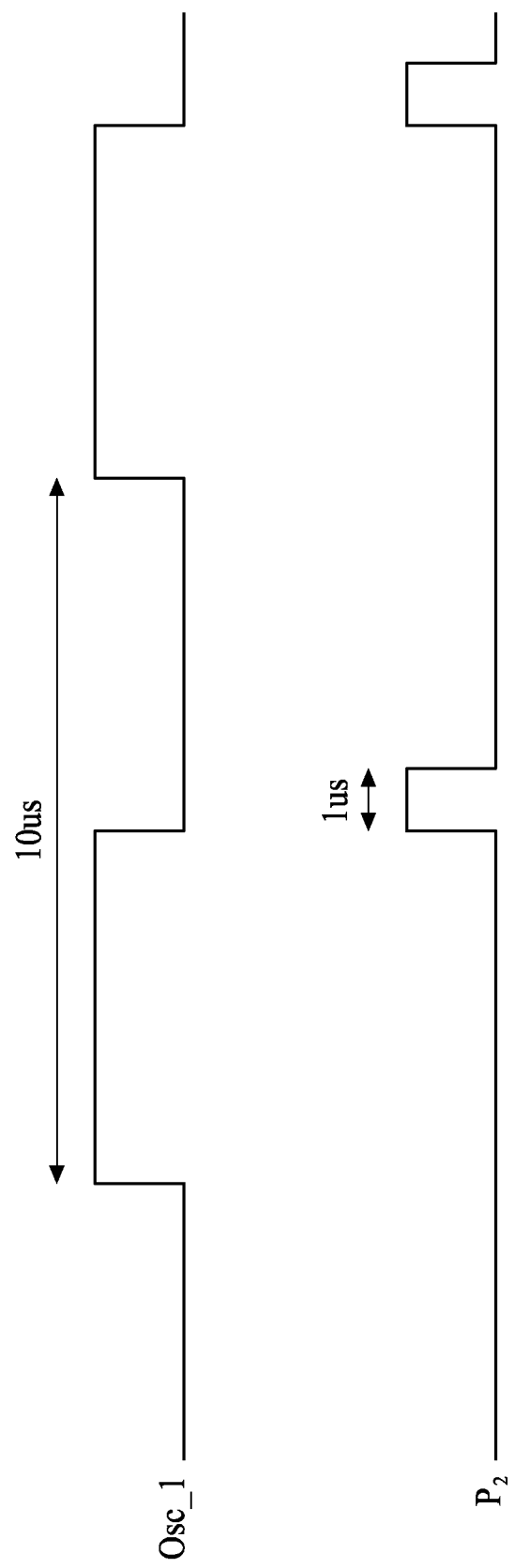
FIG. 4 is a timing diagram illustrating an oscillating signal and a pulse signal generated in accordance with another embodiment of the present invention.

FIG. 4 is a timing diagram illustrating the oscillating signal Osc_1 and a pulse signal $P_2$ generated in accordance with another embodiment of the present invention. Referring to FIG. 4, the pulse signal $P_2$ is similar to the pulse signal $P_1$ shown in FIG. 3 except that, for example, the pulse signal $P_2$ is generated at a falling edge of the oscillating signal Osc_1.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A voltage regulator circuit for providing power management for a memory device, the voltage regulator circuit comprising:
   a voltage divider;
   a voltage regulator including an output coupled to the voltage divider, the voltage regulator to regulate a voltage level at the output; and
   a switch circuit, coupled to the voltage generator, comprising:
      a first oscillator to generate an oscillating signal; and
      a pulse generator to generate a pulse signal in response to the oscillating signal,
   wherein the voltage regulator provides a current during standby mode of the memory device in response to the pulse signal, the current being smaller than one provided by the voltage regulator during normal mode of the memory device.

2. The voltage regulator circuit of claim 1 further comprising:
   a first transistor including a gate coupled to the pulse generator and a drain coupled to the voltage regulator; and
   a second transistor including a gate coupled to the pulse generator and a drain coupled to the voltage divider.

3. The voltage regulator circuit of claim 2, wherein the first transistor and the second transistor are turned on in response to the pulse signal during the standby mode.

4. The voltage regulator circuit claim 2, wherein the pulse signal is bypassed from the first transistor and the second transistor during the normal mode of the memory device.

5. The voltage regulator circuit of claim 1, wherein the pulse generator is configured to generate the pulse signal at one of a rising edge and a falling edge of the oscillating signal.

6. The voltage regulator circuit of claim 1, wherein the voltage regulator comprises:
   an operational amplifier including a non-inverting terminal coupled to the voltage divider, and an inverting terminal coupled to a reference voltage.

7. The voltage regulator circuit of claim 6, wherein the voltage regulator further comprises:
   a transistor including a gate coupled to an output of the operational amplifier, a source coupled to a voltage source, and a drain to serve as the output of the voltage regulator.

8. The voltage regulator circuit of claim 1, wherein the voltage regulator comprises:
   an operational amplifier including an inverting terminal coupled to the voltage divider, and a non-inverting terminal coupled to a reference voltage.

9. The voltage regulator circuit of claim 8, wherein the voltage regulator further comprises:
   a second oscillator coupled to an output of the operational amplifier; and
   a charge pump coupled to the second oscillator.

10. The voltage regulator circuit of claim 1 further comprising a capacitor coupled to the voltage regulator.

11. A voltage regulator circuit for providing power management for a memory device, the voltage regulator circuit comprising:
   a voltage regulator; and
   a switch circuit, coupled to the voltage generator, comprising:
      a first oscillator to generate an oscillating signal; and
      a pulse generator to generate a pulse signal in response to the oscillating signal,
   wherein the voltage regulator provides a current during standby mode of the memory device in response to the pulse signal, the current being smaller than one provided by the voltage regulator during normal mode of the memory device.

12. The voltage regulator circuit of claim 11 further comprising:
   a first transistor including a gate coupled to the pulse generator and a drain coupled to the voltage regulator; and
   a second transistor including a gate coupled to the pulse generator and a drain coupled to a voltage divider.

13. The voltage regulator circuit of claim 12, wherein the first transistor and the second transistor are turned on in response to the pulse signal during the standby mode.

14. The voltage regulator circuit claim 12, wherein the pulse signal is bypassed from the first transistor and the second transistor during the normal mode of the memory device.

15. The voltage regulator circuit of claim 11, wherein the pulse generator is configured to generate the pulse signal at one of a rising edge and a falling edge of the oscillating signal.

16. The voltage regulator circuit of claim 11, wherein the voltage regulator comprises:
   an operational amplifier including a non-inverting terminal coupled to a voltage divider, and an inverting terminal coupled to a reference voltage.

17. The voltage regulator circuit of claim 16, wherein the voltage regulator further comprises:
   a transistor including a gate coupled to an output of the operational amplifier, a source coupled to a voltage source, and a drain coupled to the voltage divider.

18. The voltage regulator circuit of claim 11, wherein the voltage regulator comprises:
   an operational amplifier including an inverting terminal coupled to a voltage divider, and a non-inverting terminal coupled to a reference voltage.

19. The voltage regulator circuit of claim 18, wherein the voltage regulator further comprises:
   a second oscillator coupled to an output of the operational amplifier; and
   a charge pump coupled to the second oscillator.

20. The voltage regulator circuit of claim 11 further comprising a capacitor coupled to the voltage regulator.

* * * * *